United States Patent
Lu et al.

(10) Patent No.: US 12,408,342 B2
(45) Date of Patent: Sep. 2, 2025

(54) MEMORY DEVICE WITH MULTI-LAYERED CHARGE STORAGE STACK

(71) Applicant: MACRONIX INTERNATIONAL CO., LTD., Hsinchu (TW)

(72) Inventors: Chi-Pin Lu, Zhubei (TW); Pei-Ci Jhang, Zhudong Township, Hsinchu County (TW); Masaru Nakamichi, Chigasaki (JP); Ling-Wuu Yang, Hsinchu (TW); Kuang-Chao Chen, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 579 days.

(21) Appl. No.: 17/837,227

(22) Filed: Jun. 10, 2022

(65) Prior Publication Data

US 2023/0403852 A1    Dec. 14, 2023

(51) Int. Cl.
*H10B 43/27* (2023.01)

(52) U.S. Cl.
CPC .................................... *H10B 43/27* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | | |
|---|---|---|---|
| 9,899,410 B1 * | 2/2018 | Cho | H10D 30/6892 |
| 11,495,618 B2 | 11/2022 | Lin et al. | |
| 2006/0267072 A1 * | 11/2006 | Bhattacharyya | H10D 64/511 |
| | | | 257/E29.128 |

(Continued)

FOREIGN PATENT DOCUMENTS

| | | |
|---|---|---|
| CN | 113892139 A | 1/2022 |
| TW | 202205641 A | 2/2022 |

*Primary Examiner* — William B Partridge
*Assistant Examiner* — Gustavo G Ramallo
(74) *Attorney, Agent, or Firm* — McClure, Qualey & Rodack, LLP

(57) ABSTRACT

An integrated circuit structure includes a plurality of gate layers, a laterally stacked multi-layered memory structure, and a vertical channel layer. The gate layers laterally extend above the substrate and spaced apart from each other. The laterally stacked multi-layered memory structure extends upwardly above the substrate and through the gate layers and including a blocking layer, a charge storage stack, and a tunneling layer. The charge storage stack is on the blocking layer and including a first silicon nitride layer, a second silicon nitride layer, and a silicon oxynitride layer sandwiched between the first and second silicon nitride layers. The tunneling layer is on the charge storage stack. The vertical channel layer is on the laterally stacked multi-layered memory structure.

10 Claims, 18 Drawing Sheets

(56) References Cited

U.S. PATENT DOCUMENTS

| | | | |
|---|---|---|---|
| 2016/0064409 A1* | 3/2016 | Yaegashi | H10B 43/35 |
| | | | 438/268 |
| 2017/0263623 A1* | 9/2017 | Zhang | H01L 21/02636 |
| 2017/0271356 A1* | 9/2017 | Ishida | H10D 64/691 |
| 2018/0158947 A1 | 6/2018 | Yeh et al. | |
| 2019/0296039 A1* | 9/2019 | Maeda | H10D 30/696 |
| 2022/0310173 A1 | 9/2022 | Deng et al. | |

* cited by examiner

MEMORY DEVICE WITH MULTI-LAYERED CHARGE STORAGE STACK

BACKGROUND

Field of Invention

The present invention relates to a memory device. More particularly, the present invention relates to a method for forming a memory device.

Description of Related Art

The present disclosure generally relates to semiconductor devices, and particularly to methods of making a 3-dimensional (3D) memory device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

SUMMARY

The disclosure provides an integrated circuit structure includes a plurality of gate layers, a laterally stacked multi-layered memory structure, and a vertical channel layer. The gate layers laterally extend above the substrate and any adjacent two of the gate layers is spaced apart from each other by an insulating layer. The laterally stacked multi-layered memory structure extends upwardly above the substrate and through the gate layers and including a blocking layer, a charge storage stack, and a tunneling layer. The charge storage stack is on the blocking layer and including a first silicon nitride layer, a second silicon nitride layer, and a silicon oxynitride layer sandwiched between the first and second silicon nitride layers. The first silicon nitride layer is closer to the blocking layer than the second silicon nitride layer. The tunneling layer is on the charge storage stack. The vertical channel layer is on the laterally stacked multi-layered memory structure.

In some embodiments, the first silicon nitride layer has a greater nitrogen atomic concentration than the second silicon nitride layer.

In some embodiments, the first silicon nitride layer is in contact with the blocking layer.

In some embodiments, the first silicon nitride layer has a less refractive index than the second silicon nitride layer.

In some embodiments, the first silicon nitride layer has a refractive index in a range from about 2.00 to about 2.03, and the second silicon nitride layer has a refractive index in a range from about 2.07 to about 2.10.

In some embodiments, the silicon oxynitride layer has a less refractive index than the first and second silicon nitride layers.

In some embodiments, the silicon oxynitride layer has a refractive index in a range from about 1.52 to about 1.65.

In some embodiments, the silicon oxynitride layer has a thinner thickness than the first and second silicon nitride layers.

In some embodiments, the silicon oxynitride layer has a greater oxygen atomic concentration than the first and second silicon nitride layers.

In some embodiments, the first and second silicon nitride layers are free of oxygen.

The disclosure provides a method for forming a memory device. The method includes forming a multi-layered stack including insulating layers and gate layers alternately stacked in a vertical direction over a substrate; etching the multi-layered stack to form a through opening; forming a blocking layer lining a sidewall of the through opening; forming a first silicon nitride layer on the blocking layer; forming a silicon oxynitride layer on the first silicon nitride layer; forming a second silicon nitride layer on the silicon oxynitride layer; forming a tunneling layer on the second silicon nitride layer; forming a channel layer on the tunneling layer.

In some embodiments, forming the first silicon nitride layer is performed by introducing a first nitrogen-containing gas over the substrate having a first flow rate, and forming the second silicon nitride layer is performed by introducing a second nitrogen-containing gas over the substrate having a second flow rate less than the first flow rate.

In some embodiments, the first flow rate of forming the first silicon nitride layer is in a range from about 5 to about 20 slm, and the second flow rate of forming the second silicon nitride layer is in a range from about 1 to about 5 slm.

In some embodiments, forming the first silicon nitride layer is performed at a first temperature, and forming the second silicon nitride layer is performed at a second temperature substantially the same as the first temperature.

In some embodiments, the first silicon nitride layer has a greater nitrogen atomic concentration than the second silicon nitride layer.

In some embodiments, forming the first silicon nitride layer is performed under a first pressure, and forming the second silicon nitride layer is performed under a second pressure substantially the same as the first pressure.

In some embodiments, the first silicon nitride layer has a less refractive index than the second silicon nitride layer.

In some embodiments, forming the second silicon nitride layer is performing by introducing a mixture gas comprising $Si_2Cl_6$ and $NH_3$.

In some embodiments, forming the silicon oxynitride layer is performing by introducing a mixture gas comprising $Si_2Cl_6$, $NH_3$, and $O_2$.

In some embodiments, forming the silicon oxynitride layer and the first and second silicon nitride layers are in-situ performed.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
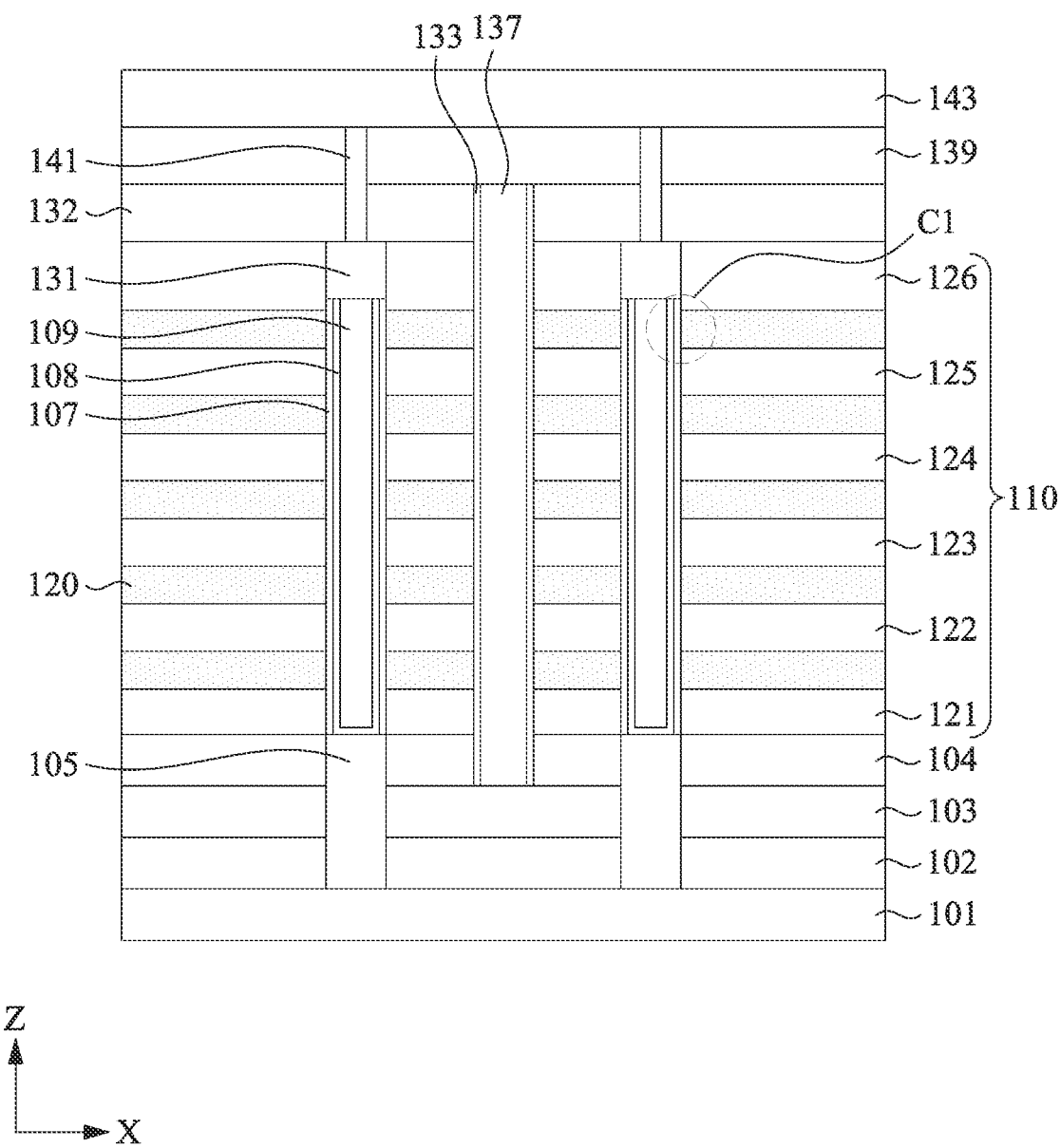
FIG. 1 is a cross-sectional view illustrating an integrated circuit (IC) structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

For next generation semiconductor devices, it is desirable to include memories that can provide high density storage. Therefore, a 3-dimensional (3D) integrated circuit (IC) memory device, such as 3D NAND, can provide high density storage by its multi-layered structure. However, the 3D NAND including a single charge storage layer with one composition may have a NAND retention issue. Therefore, the present disclosure in various embodiments provides a charge storage structure having a multi-layer sandwiched between a blocking layer and a tunneling layer of the 3D NAND to address the NAND retention issue. The multi-layer charge storage structure can be a composite layer having a nitride-oxide-nitride (NON) structure with a deep storage ability and a better data retention performance for the 3D NAND.

Figure 2:
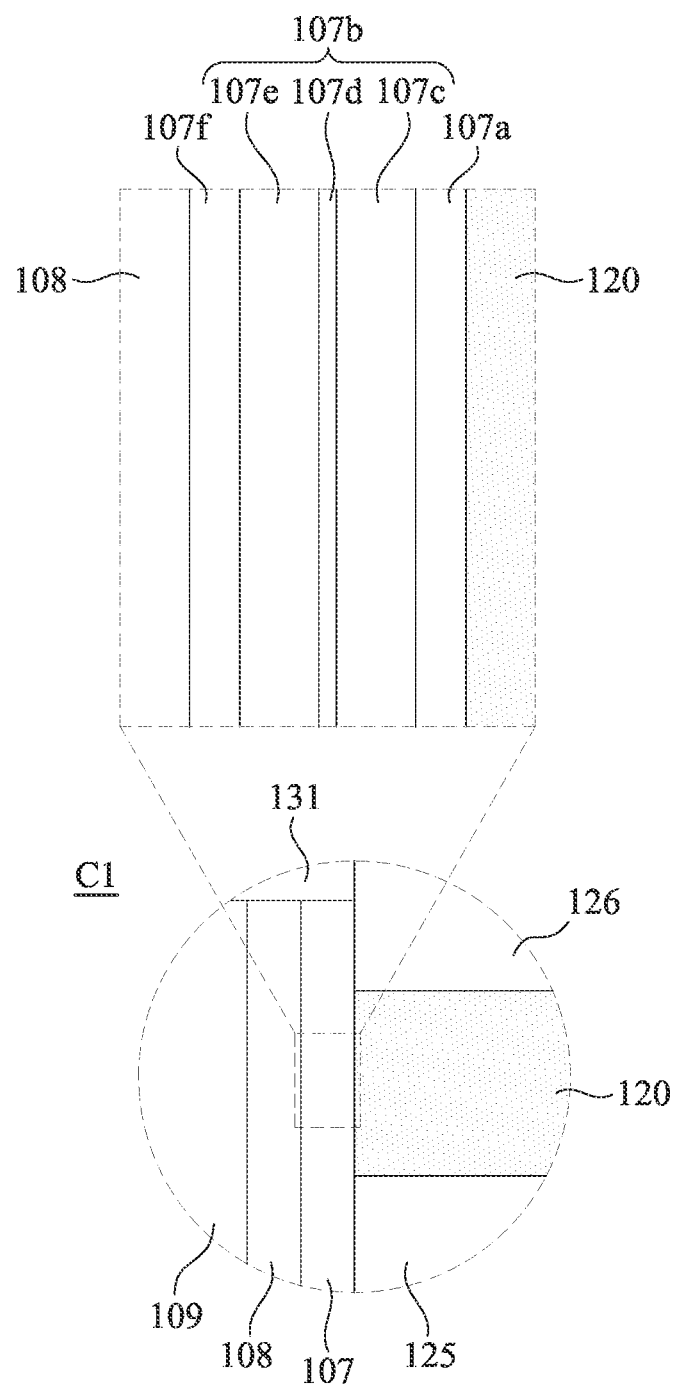
FIG. 2 illustrates a local enlarged view of the IC structure according to FIG. 1 in the region C1.

Reference is made to FIGS. 1 and 2. FIG. 1 is a cross-sectional view illustrating an integrated circuit (IC) structure in accordance with some embodiments of the present disclosure. FIG. 2 illustrates a local enlarged view of the IC structure according to FIG. 1 in the region C1. As shown in FIG. 1, an isolation layer 102, a conductive layer 103, and an isolation layer 104 are formed in sequence on a semiconductor substrate 101. In some embodiments, the conductive layer 103 can serve as a common source line of the memory device. A plurality of contact plugs 105 extend through the isolation layer 102, the conductive layer 103, and the isolation layer 104 to electrically contact the semiconductor substrate 101 with the conductive layer 103. In some embodiments, the contact plugs 105 extend downwardly through the conductive layer 103 and the isolation layer 104 and terminate prior to reaching the isolation layer 102, such that contact plugs 105 are not in contact with the semiconductor substrate 101. A plurality of gate layers 120 and a plurality of insulating layers 121-126 laterally extend above the semiconductor substrate 101 and are alternatively stacked on the semiconductor substrate 101 along Z-direction.

As shown in FIG. 1, a multi-layered memory structure 107 extends upwardly above the semiconductor substrate 101 and through the gate layers 120. As shown in FIG. 2, the multi-layered memory structure 107 include a composite layer having a blocking layer 107a, a charge storage stack 107b, and a tunneling layer 107f are laterally stacked in sequence. The charge storage stack 107b include a first silicon nitride layer 107c, a second silicon nitride layer 107e, and a silicon oxynitride layer 107d sandwiched between the first and second silicon nitride layers 107c and 107e. The first silicon nitride layer 107c is in contact with the blocking layer 107a. The first silicon nitride layer 107c can serve to contribute a better data retention performance for the IC structure 100. In some embodiments, the blocking layer 107a may be made of dielectric material, such as $AlO_x$, $HfO_x$, $ZrO_x$, combinations thereof, or other suitable dielectric materials. In some embodiments, the first silicon nitride layer 107c may be free of oxygen. In some embodiments, the first silicon nitride layer 107c may have a refractive index in a range from about 2.00 to about 2.03. In some embodiments, the first silicon nitride layer 107c may have a thickness in a range from about 20 to about 30 Angstrom. In some embodiments, the first silicon nitride layer 107c can be interchangeably referred to a nitrogen rich silicon nitride layer.

The silicon oxynitride layer 107d can serve to contribute to a better PGM/ERS performance for the IC structure 100. In some embodiments, the silicon oxynitride layer 107d may have a greater oxygen atomic concentration than the first silicon nitride layer 107c. In some embodiments, the silicon oxynitride layer 107d may have a less refractive index than the first silicon nitride layer 107c. For example, the silicon oxynitride layer 107d may have a refractive index in a range from about 1.52 to about 1.65. In some embodiments, the silicon oxynitride layer 107d may have a thinner thickness than the first silicon nitride layer 107c. For example, the silicon oxynitride layer 107d may have a thickness in a range from about 10 to about 15 Angstrom.

The second silicon nitride layer 107e can serve to contribute a shallow storage ability for the IC structure 100, such that the erase ability of the silicon oxynitride layer 107d may be further improved by pulling in the electron from the second silicon nitride layer 107e. In some embodiments, the first silicon nitride layer 107c may have a greater nitrogen atomic concentration than the second silicon nitride layer 107e. In some embodiments, the silicon oxynitride layer 107d may have a greater oxygen atomic concentration than the second silicon nitride layer 107e. In some embodiments, the second silicon nitride layer 107e may be free of oxygen. In some embodiments, the first silicon nitride layer 107c may have a less refractive index than the second silicon nitride layer 107e. For example, the second silicon nitride layer 107e may have a refractive index in a range from about 2.07 to about 2.10. In some embodiments, the silicon oxynitride layer 107d may have a less refractive index than the second silicon nitride layer 107e. In some embodiments, the second silicon nitride layer 107e may have a substantially same thickness as the first silicon nitride layer 107c.

For example, the second silicon nitride layer 107e may have a thickness in a range from about 20 to about 30 Angstrom. In some embodiments, the silicon oxynitride layer 107d may have a thinner thickness than the second silicon nitride layer 107e.

The tunneling layer 107f is formed on the second silicon nitride layer 107e of the charge storage stack 107b. In some embodiments, the tunneling layer 107f may be made of oxide (e.g. $SiO_2$), SiON (silicon-oxide-nitride) or ONO (oxide-nitride-oxide).

As shown in FIG. 2, a vertical channel layer 108 is on the multi-layered memory structure 107. Therefore, a plurality of memory cells 127 can be defined at the points of intersection between the gate layers 120, the multi-layered memory structure 107, and the channel layer 108, so as to form a memory cell array in the multi-layered stack 110. In some embodiments, the channel layer 108 may be made of semiconductor material, such as such as poly-silicon (Si), Ge or other doped/undoped semiconductor material. For example, the channel layer 108 may be made of undoped poly-silicon.

Referring back to FIG. 1, a dielectric material 109 is deposited over the channel layer 108. Therefore, the channel layer 108 wraps around the dielectric material 109, and the multi-layered memory structure 107 wraps around the channel layer 108. In some embodiments, the dielectric material 109 may be made of, such as silicon dioxide ($SiO_2$). Bonding pads 131 are formed over the dielectric material 109 to form an electrical contact with the channel layer 108. A capping layer 132 is over the bond pads 131 and the multi-layered stack 110. The capping layer 132 may be made of dielectric material, such as silicon oxide, silicon nitride (SiN), silicon oxynitride (SiON), silicate or the arbitrary combinations thereof. A metal plug 137 extends through the capping layer 132, the gate layers 120, and the insulating layers 121-126. A dielectric spacer 133 laterally surrounds the metal plug 137. The metal plug 137 can be electrically insulated from the gate layers 120 by the dielectric spacer 133. An inter-layer dielectric (ILD) layer 139 is over the dielectric spacer 133 and the metal plug 137. A plurality of bit lines 143 electrically connected to the bonding pads 131 with an interconnection via 141 formed in the ILD layer 139.

Figure 3:
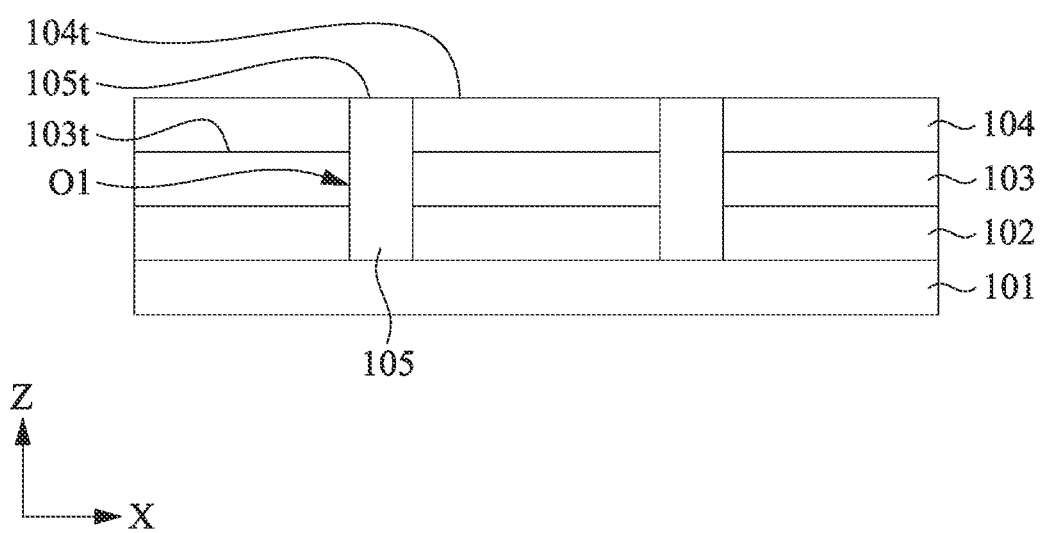
FIGS. 3-5, 6A, and 7-14 are cross-sectional views illustrating a method in various stages of forming an IC structure in accordance with some embodiments of the present disclosure.

FIGS. 3-5, 6A, and 7-14 are cross-sectional views illustrating a method in various stages of forming an IC structure 100 in accordance with some embodiments of the present disclosure. Referring to FIG. 3, in some embodiments, an isolation layer 102, a conductive layer 103, and an isolation layer 104 are formed in sequence on a semiconductor substrate 101. In some embodiments, the conductive layer 103 can serve as a common source line of the memory device. Subsequently, a plurality of contact openings O1 are formed to pass through the isolation layer 104, the conductive layer 103, and the isolation layer 102 to expose portions of the semiconductor substrate 101. In some embodiments, the contact openings O1 are formed to extend downwardly through the conductive layer 103 and the isolation layer 104 and terminate prior to reaching the isolation layer 102, such that the contact openings O1 do not expose the semiconductor substrate 101. Subsequently, a plurality of contact plugs 105 are respectively formed in the contact openings O1 to electrically contact the semiconductor substrate 101 with the conductive layer 103. In some embodiments, because the contact openings O1 can be formed in the isolation layer 102 and not expose the semiconductor substrate 101, the contact plugs 105 formed in the contact openings O1 can be not in contact with the semiconductor substrate 101.

In some embodiments, the forming of the contact plugs 105 includes performing an etching process to remove portions of the isolation layer 104, the conductive layer 103, and the isolation layer 102, so as to form the contact openings O1. Subsequently, a conductive material, such as poly-silicon, is formed on the isolation layer 104 to fill the contact openings O1 by a deposition process, such as a low pressure chemical vapor deposition (LPCVD) process. Subsequently, a planarization process, such as a chemical mechanical polish (CMP) process, using the isolation layer 104 as a stop layer is performed to remove portions of the conductive material above the isolation layer 104, such that the contact plugs 105 are formed. Therefore, each of the contact plugs 105 has a top surface 105t substantially higher than a top surface 103t of the conductive layer 103 and substantially level with a top surface 104t of the isolation layer 104.

In some embodiments, the semiconductor substrate 101 may be made of a p-type doped, n-type doped or undoped semiconductor material, such as poly-silicon, germanium (Ge) or any other suitable semiconductor material. In some embodiments, the isolation layers 102 and 104 may be made of dielectric material, such as silicon oxide, silicon nitride (SiN), silicon oxynitride (SiON), silicate or the arbitrary combinations thereof. In some embodiments, the contact plugs 105 may be made of TiN, TaN, Ti, Ta, Cu, Al, Ag, W, Ir, Ru, Pt, combinations thereof, or other suitable conductive materials.

Figure 4:
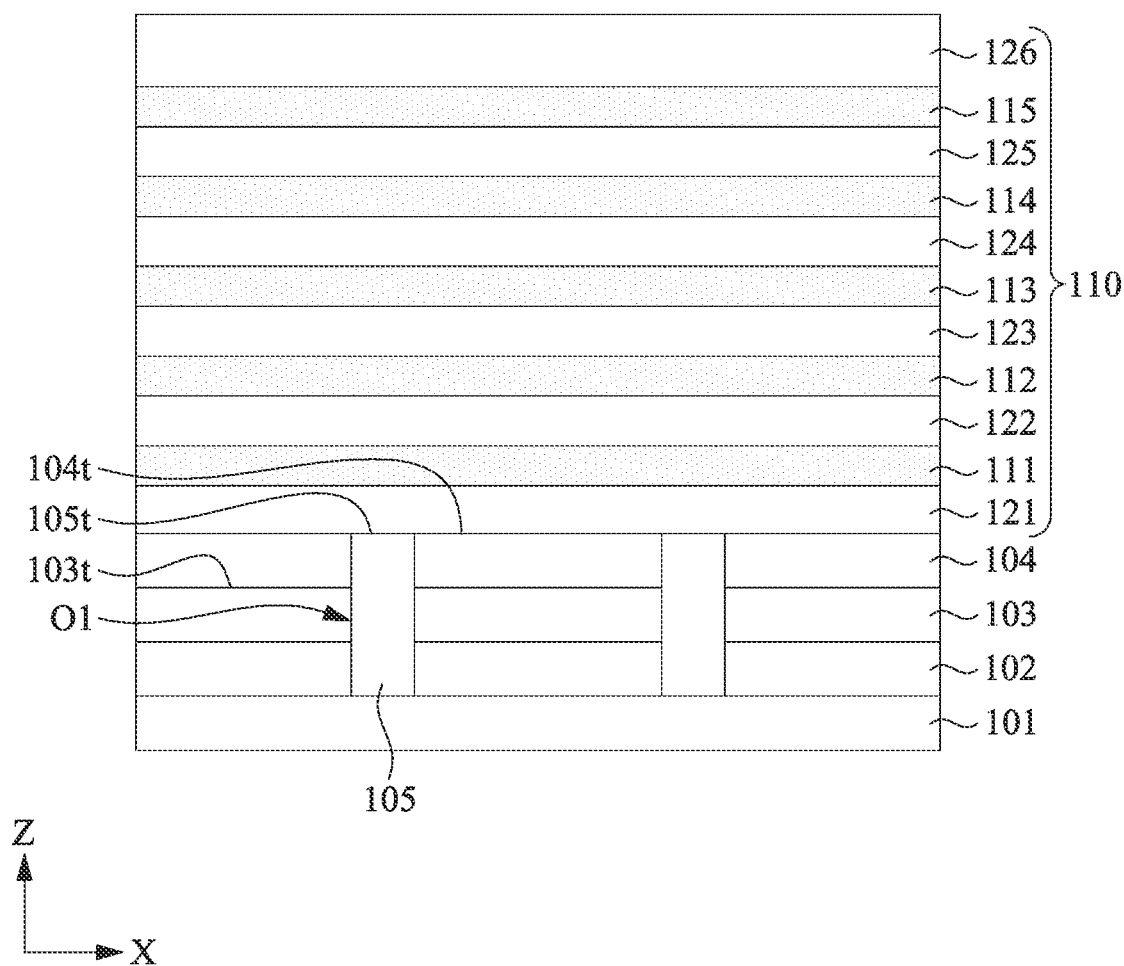

With reference to FIG. 4, a multi-layered stack 110 including alternating insulating layers 121-126 and sacrificial layers 111-115 is formed on the semiconductor substrate 101. The insulating layers 121-126 and the sacrificial layers 111-115 are parallel to each other and alternatively stacked on the semiconductor substrate 101 along Z-direction. The insulating layer 121 and the insulating layer 126 respectively serve as the bottommost layer and the topmost layer of the multi-layered stack 110. In some embodiments, the multi-layered stack 110 can be interchangeably referred to a film stack.

In some embodiments, the sacrificial layers 111-115 may be made of silicon-nitride compounds, such as SiN, SiON, silicon carbonitride (SiCN), or the arbitrary combinations thereof. In some embodiments, the insulating layers 121-126 may be made of dielectric material, such as silicon oxide, SiN, SiON, silicate or the arbitrary combinations thereof. In some embodiments, the topmost insulating layer 126 can be interchangeably referred to a hard mask oxide layer. However, it should be appreciated that, in the embodiments of the present disclosure, the sacrificing layers 111-115 and the insulating layers 121-126 are made of different material. For example, the sacrificial layers 111-115 may be made of silicon nitride, and the insulating layers 121-126 may be made of silicon oxide. In some embodiments, the sacrificial layers 111-115 and the insulating layers 121-126 can be formed by low pressure chemical vapor deposition (LPCVD) process.

Figure 5:
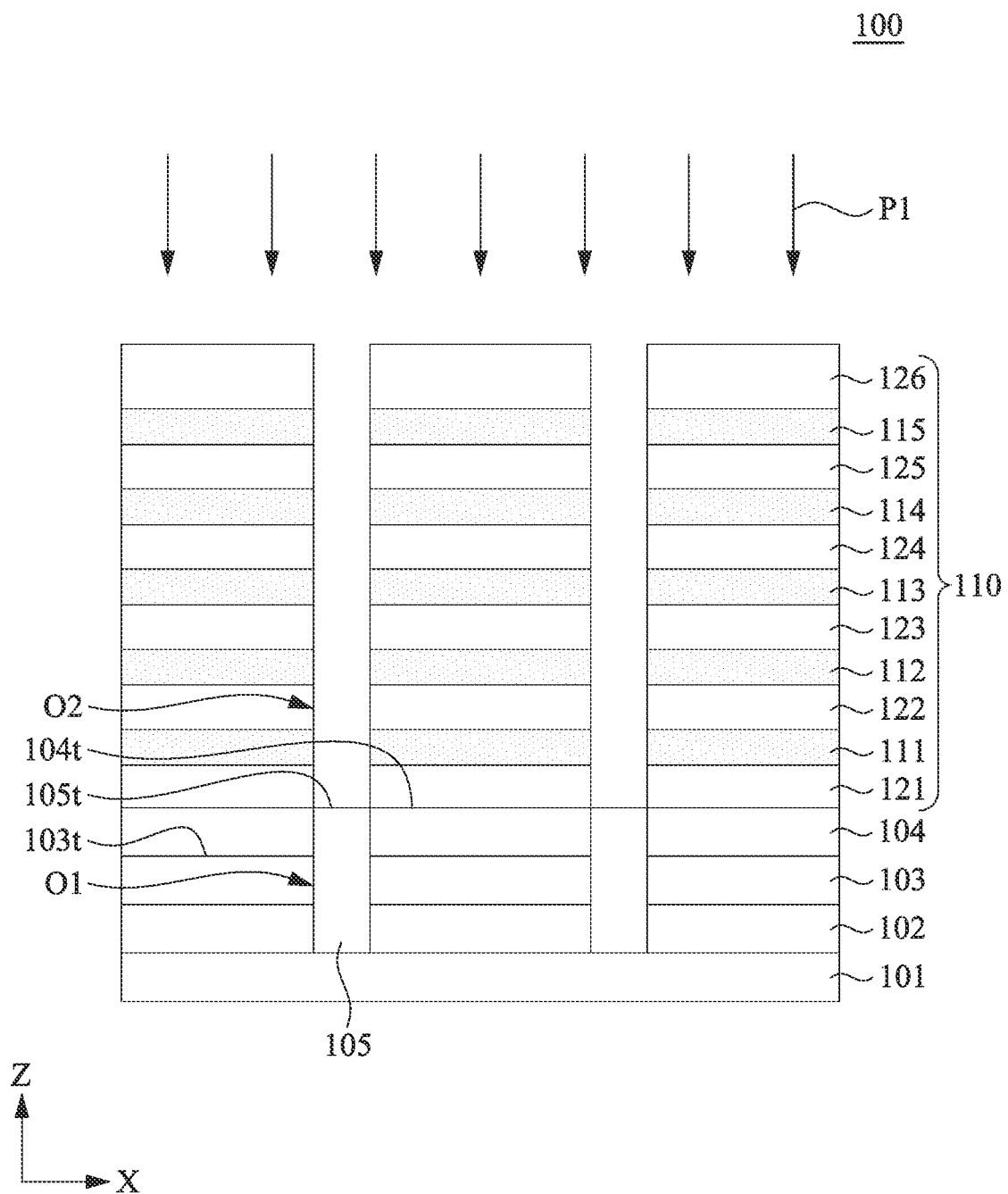

With reference to FIG. 5, an etching process P1, such as a hole etch process, is performed to form a plurality of through openings O2 passing through the multi-layered stack 110 to expose the contact plugs 105. In some embodiments, the etching process P1 can be an anisotropic etching process, such as a reactive ion etching (RIE) process, performed on the multi-layered stack 110 using a patterned hard mask layer (not shown) as an etching mask. The through openings O2 may be a plurality of circular through holes passing through the multi-layered stack 110 along Z-direction and terminate at the surface 105t of the contact plugs 105. The through openings O2 can be used to expose portions of the sacrificial layers 111-115 and the insulating layers 121-126 serving as sidewalls of the through openings O2.

Figure 6A:
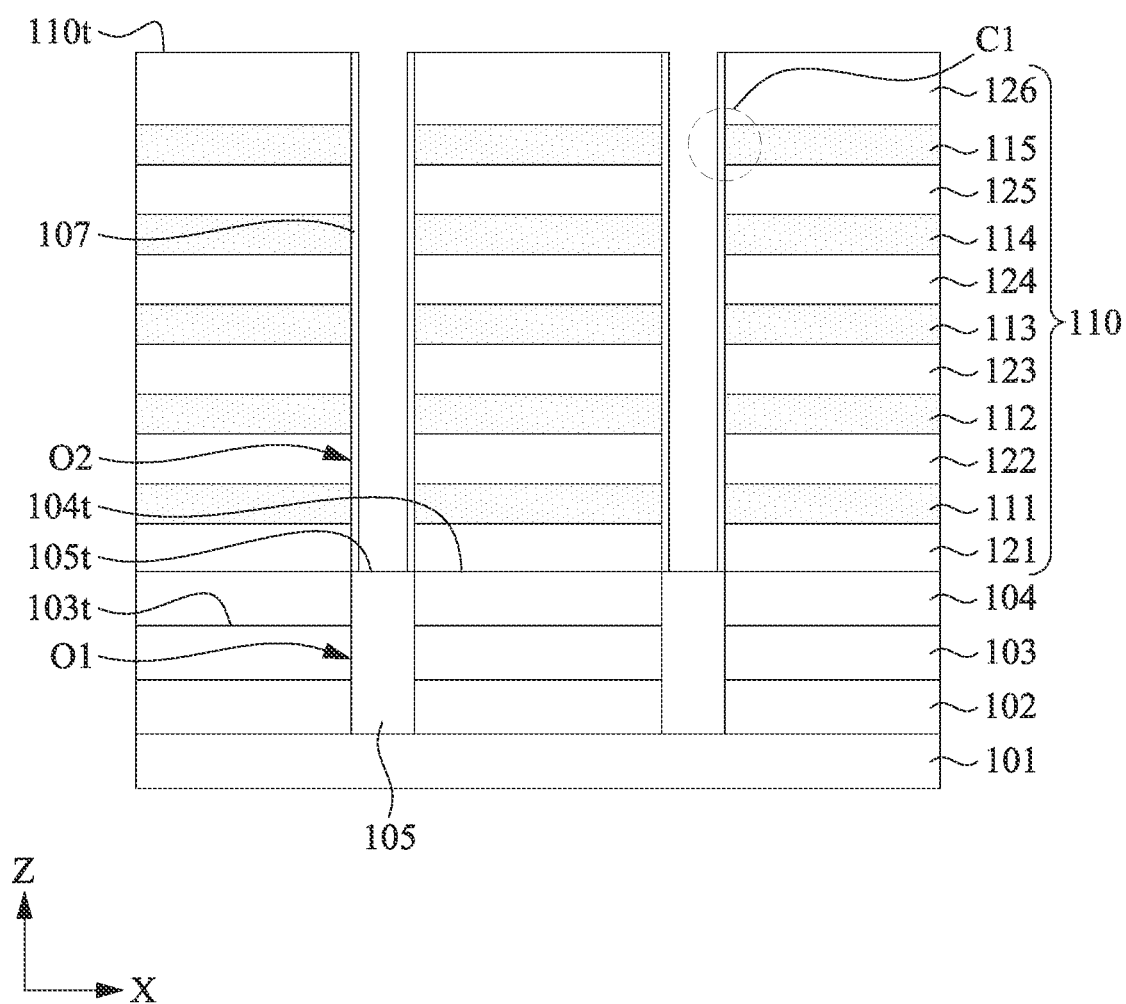

With reference to FIG. 6A, a multi-layered memory structure 107 is formed on sidewalls of the through opening O2. In some embodiments, a 3D IC memory device, such as 3D NAND, can provide high density storage by its multi-layered structure. However, the 3D NAND including a single charge storage layer with one composition may have a NAND retention issue. Therefore, the present disclosure in various embodiments provides a charge storage structure sandwiched between the blocking layer and the tunneling layer and having a multi-layer to address the NAND retention issue. The multi-layer charge storage structure may be a composite layer having (but not limited to) a nitride-oxide-nitride (NON) structure. In some embodiments, a first layer in the multi-layer charge storage structure can serve as a SiN layer with a deep storage ability for the 3D NAND, and can contribute to a better data retention performance for the 3D NAND. A second layer in the multi-layer charge storage structure can serve as a SiON layer for a band engineering, and can contribute to a better PGM/ERS performance for the 3D NAND. A third layer in the multi-layer charge storage structure can serve as a SiN layer with shallow storage ability for the IC structure, such that the erase ability of the second layer may be further improved by pulling in the electron from the third layer. In some embodiments, this disclosure can extend to semiconductor products, such as flash memory (DRAM, NBit, NOR Flash, 3D NAND Flash, or 3D AND flash), and logic products, while the multi-layer charge storage structure is implemented.

As shown in FIG. 6A, the multi-layered memory structure 107 may include a composite layer having a blocking layer 107a (see FIG. 6E), a charge storage stack 107b (see FIG. 6E), and a tunneling layer 107f (see FIG. 6E) formed to conformally blanket over the multi-layered stack 110, the sidewalls, and the bottoms of the through openings O2. The charge storage stack 107b (see FIG. 6E) may include a first silicon nitride layer 107c (see FIG. 6E), a second silicon nitride layer 107e (see FIG. 6E), and a silicon oxynitride layer 107d (see FIG. 6E) sandwiched between the first and second silicon nitride layers 107c and 107e. Subsequently, an etching process is performed to remove portions of the composite layer disposed on a top surface 110t of the multi-layered stack 110 and the bottoms of the through openings O2, such that the top surface 105t of the contact plugs 105 are exposed.

Figure 6B:
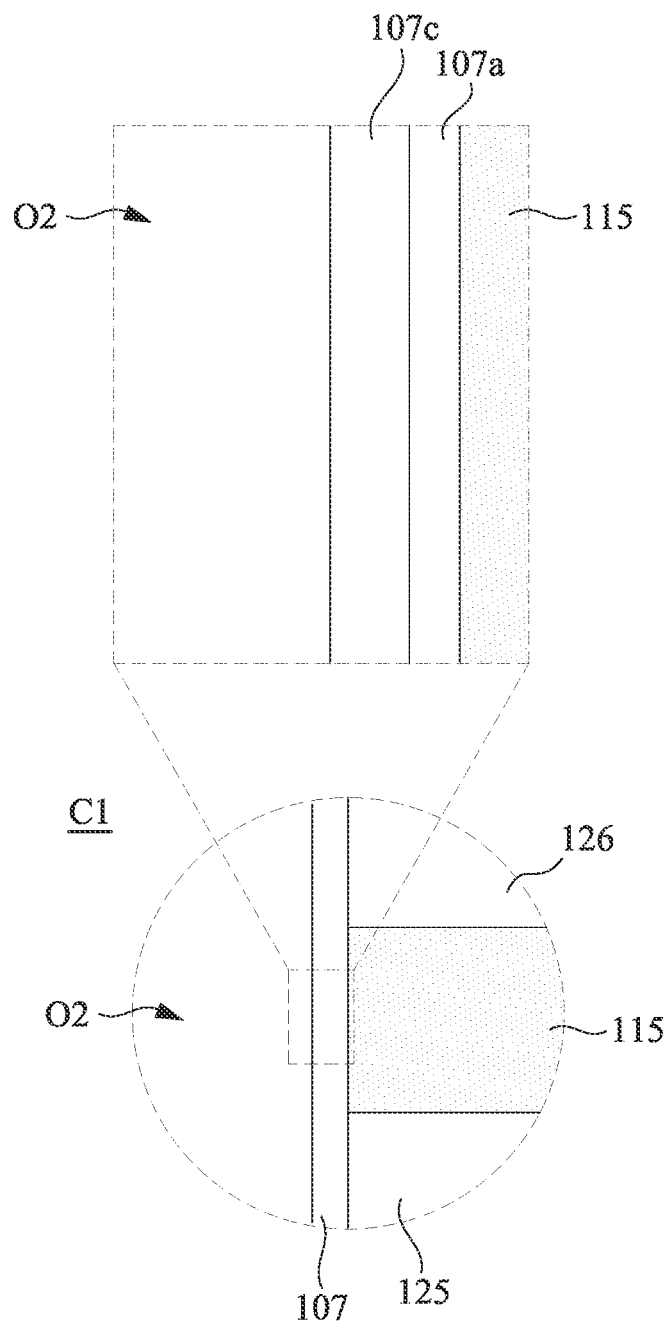
FIGS. 6B-6E are local enlarged views illustrating a method in various stages of forming the IC structure according to FIG. 6A in the region C1.

Reference is made to FIGS. 6B-6E. FIGS. 6B-6E are local enlarged views illustrating a method in various stages of forming the IC structure 100 according to FIG. 6A in the region C1. With reference to FIG. 6B, a blocking layer 107a is formed to conformally blanket over the multi-layered stack 110, the sidewalls, and the bottoms of the through openings O2. Subsequently, the first silicon nitride layer 107c of the charge storage stack 107b is conformally formed on the blocking layer 107a. The first silicon nitride layer 107c is in contact with the blocking layer 107a. The first silicon nitride layer 107c can serve to contribute a better data retention performance for the IC structure 100.

In some embodiments, the blocking layer 107a may be made of dielectric material, such as $AlO_x$, $HfO_x$, $ZrO_x$, combinations thereof, or other suitable dielectric materials. In some embodiments, the first silicon nitride layer 107c may be free of oxygen. In some embodiments, the first silicon nitride layer 107c may have a refractive index in a range from about 2.00 to about 2.03. In some embodiments, the first silicon nitride layer 107c may have a thickness in a range from about 20 to about 30 Angstrom. In some embodiments, the first silicon nitride layer 107c can be interchangeably referred to a nitrogen rich silicon nitride layer.

In some embodiments, forming the first silicon nitride layer 107c is performing by introducing a mixture gas including a silicon-containing gas, such as $Si_2Cl_6$, and a nitrogen-containing gas, such as $NH_3$, over the semiconductor substrate 101. By way of example but not limiting the present disclosure, for forming the first silicon nitride layer 107c, the silicon-containing gas, such as $Si_2Cl_6$, may be introduced over the semiconductor substrate 101 at a temperature in a range from about 600 to about 680° C., at a flow rate in a range from about 0.5 to about 2.0 slm (standard liter per minute), and under a pressure in a range from about 0.1 to about 1.0 Torr. The nitrogen-containing gas, such as $NH_3$, may be introduced over the semiconductor substrate 101 at a temperature in a range from about 600 to about 680° C., at a flow rate in a range from about 5 to about 20 slm, and under a pressure in a range from about 0.1 to about 10.0 Torr. In some embodiments, the blocking layer 107a and/or the first silicon nitride layer 107c can be formed by a chemical vapor deposition (CVD) process.

Figure 6C:
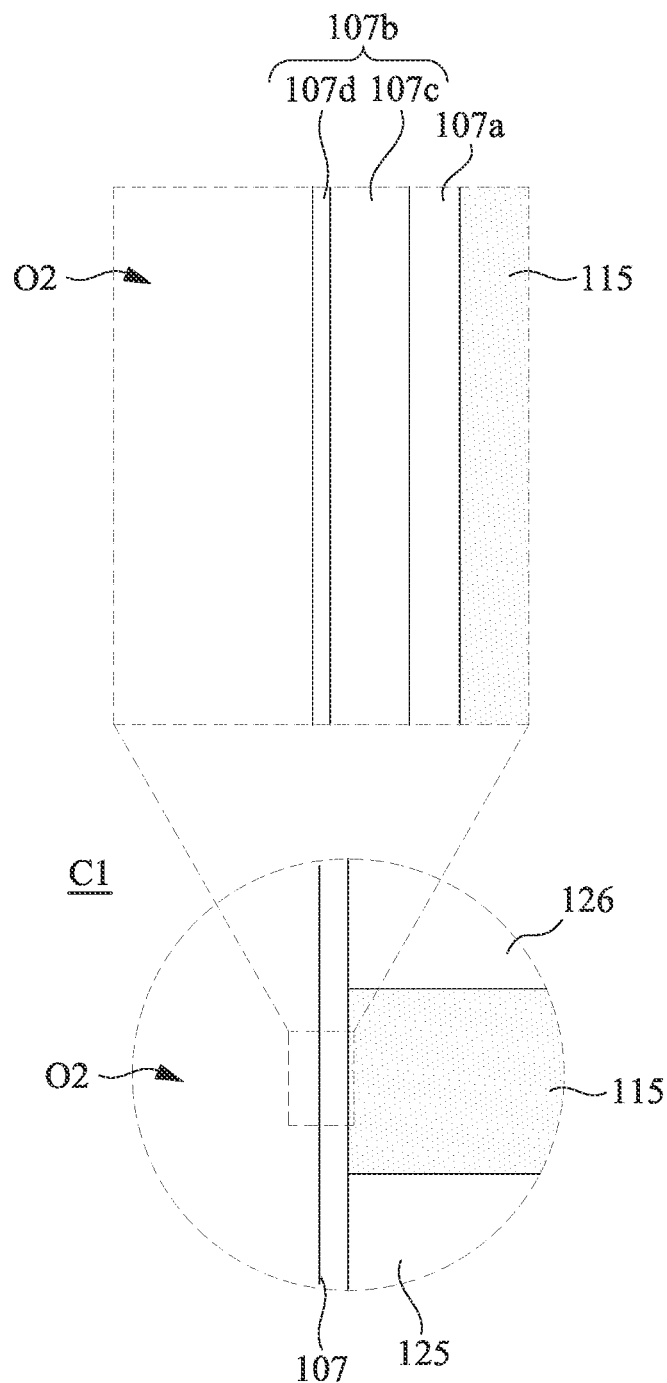

With reference to FIG. 6C, the silicon oxynitride layer 107d of the charge storage stack 107b is conformally formed on first silicon nitride layer 107c. The silicon oxynitride layer 107d can serve to contribute to a better PGM/ERS performance for the IC structure 100.

In some embodiments, the silicon oxynitride layer 107d may have a greater oxygen atomic concentration than the first silicon nitride layer 107c. In some embodiments, the silicon oxynitride layer 107d may have a less refractive index than the first silicon nitride layer 107c. For example, the silicon oxynitride layer 107d may have a refractive index in a range from about 1.52 to about 1.65. In some embodiments, the silicon oxynitride layer 107d may have a thinner thickness than the first silicon nitride layer 107c. For example, the silicon oxynitride layer 107d may have a thickness in a range from about 10 to about 15 Angstrom.

In some embodiments, forming the silicon oxynitride layer 107d is performing by introducing a mixture gas including a silicon-containing gas, such as $Si_2Cl_6$, a nitrogen-containing gas, such as $NH_3$, and oxygen ($O_2$), over the semiconductor substrate 101. By way of example but not limiting the present disclosure, for forming the silicon oxynitride layer 107d, the silicon-containing gas, such as $Si_2Cl_6$, may be introduced over the semiconductor substrate 101 at a temperature in a range from about 600 to about 680° C., at a flow rate in a range from about 0.5 to about 2.0 slm, and under a pressure in a range from about 0.1 to about 1.0 Torr. The nitrogen-containing gas, such as $NH_3$, may be introduced over the semiconductor substrate 101 at a temperature in a range from about 600 to about 680° C., at a flow rate in a range from about 2.0 to about 10.0 slm, and under a pressure in a range from about 0.1 to about 10.0 Torr. In some embodiments, the silicon oxynitride layer 107d can be formed by a pressure chemical vapor deposition (CVD) process.

Figure 6D:
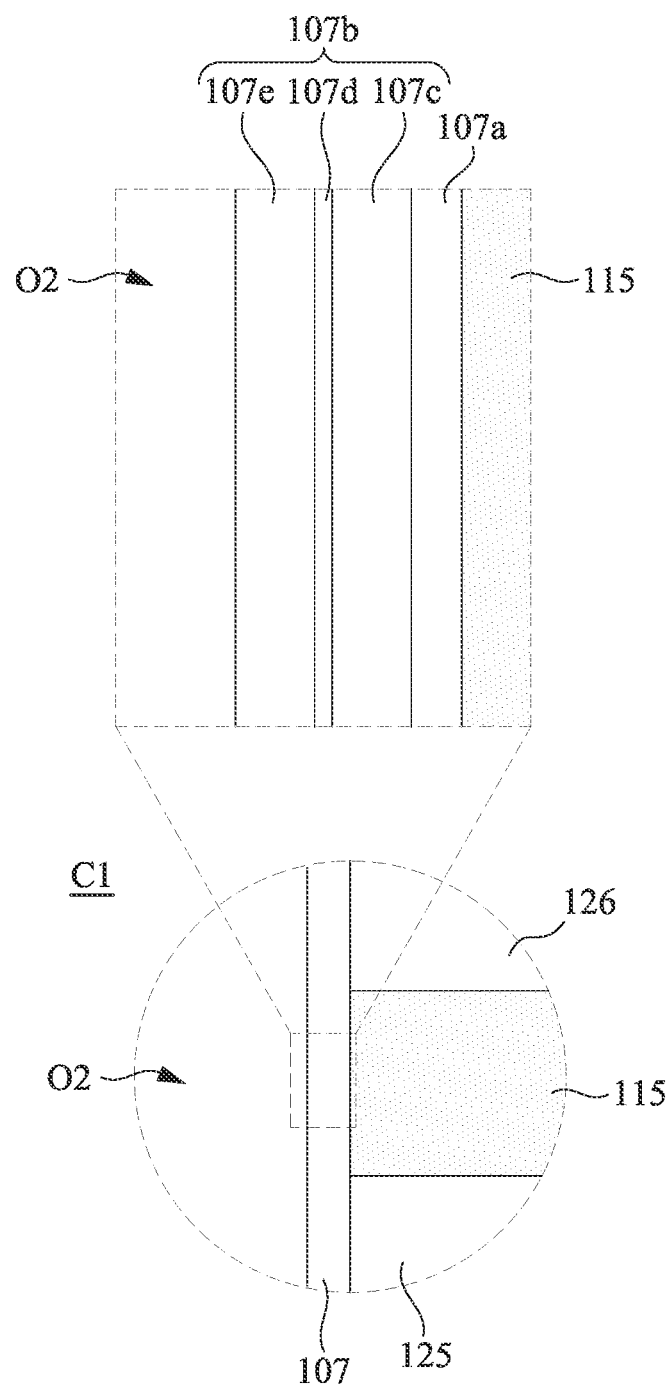

With reference to FIG. 6D, the second silicon nitride layer 107e of the charge storage stack 107b is formed on the silicon oxynitride layer 107d. The second silicon nitride layer 107e can serve to contribute a shallow trapping ability for the IC structure 100, such that the erase ability of the silicon oxynitride layer 107d may be further improved by pulling in the electron from the second silicon nitride layer 107e.

In some embodiments, the first silicon nitride layer 107c may have a greater nitrogen atomic concentration than the second silicon nitride layer 107e. In some embodiments, the silicon oxynitride layer 107d may have a greater oxygen atomic concentration than the second silicon nitride layer 107e. In some embodiments, the second silicon nitride layer 107e may be free of oxygen. In some embodiments, the first silicon nitride layer 107c may have a less refractive index than the second silicon nitride layer 107e. For example, the second silicon nitride layer 107e may have a refractive index in a range from about 2.07 to about 2.10. In some embodiments, the silicon oxynitride layer 107d may have a less refractive index than the second silicon nitride layer 107e. In some embodiments, the second silicon nitride layer 107e may have a substantially same thickness as the first silicon nitride layer 107c. For example, the second silicon nitride layer 107e may have a thickness in a range from about 20 to about 30 Angstrom. In some embodiments, the silicon oxynitride layer 107d may have a thinner thickness than the second silicon nitride layer 107e.

In some embodiments, forming the second silicon nitride layer 107e is performing by introducing a mixture gas including a silicon-containing gas, such as $Si_2Cl_6$, and a nitrogen-containing gas, such as $NH_3$, over the semiconductor substrate 101. In some embodiments, the flow rate of the nitrogen-containing gas of forming the second silicon nitride layer 107e is less than the flow rate of the nitrogen-containing gas of forming the first silicon nitride layer 107c. In some embodiments, the temperature of forming the second silicon nitride layer 107e is substantially the same as the temperature of forming the first silicon nitride layer 107c. In some embodiments, the pressure of forming the second silicon nitride layer 107e is substantially the same as the pressure of forming the first silicon nitride layer 107c. In some embodiments, forming the silicon oxynitride layer 107d and the first and second silicon nitride layer 107c and 107e are in-situ performed. By way of example but not limiting the present disclosure, for forming the second silicon nitride layer 107e, the silicon-containing gas, such as $Si_2Cl_6$, may be introduced over the semiconductor substrate 101 at a temperature in a range from about 600 to about 680° C., at a flow rate in a range from about 0.5 to about 2.0 slm, and under a pressure in a range from about 0.1 to about 1.0 Torr. The nitrogen-containing gas, such as $NH_3$, may be introduced over the semiconductor substrate 101 at a temperature in a range from about 600 to about 680° C., at a flow rate in a range from about 1 to about 5 slm, and under a pressure in a range from about 0.1 to about 10.0 Torr. In some embodiments, the second silicon nitride layer 107e can be formed by a pressure chemical vapor deposition (CVD) process.

Figure 6E:
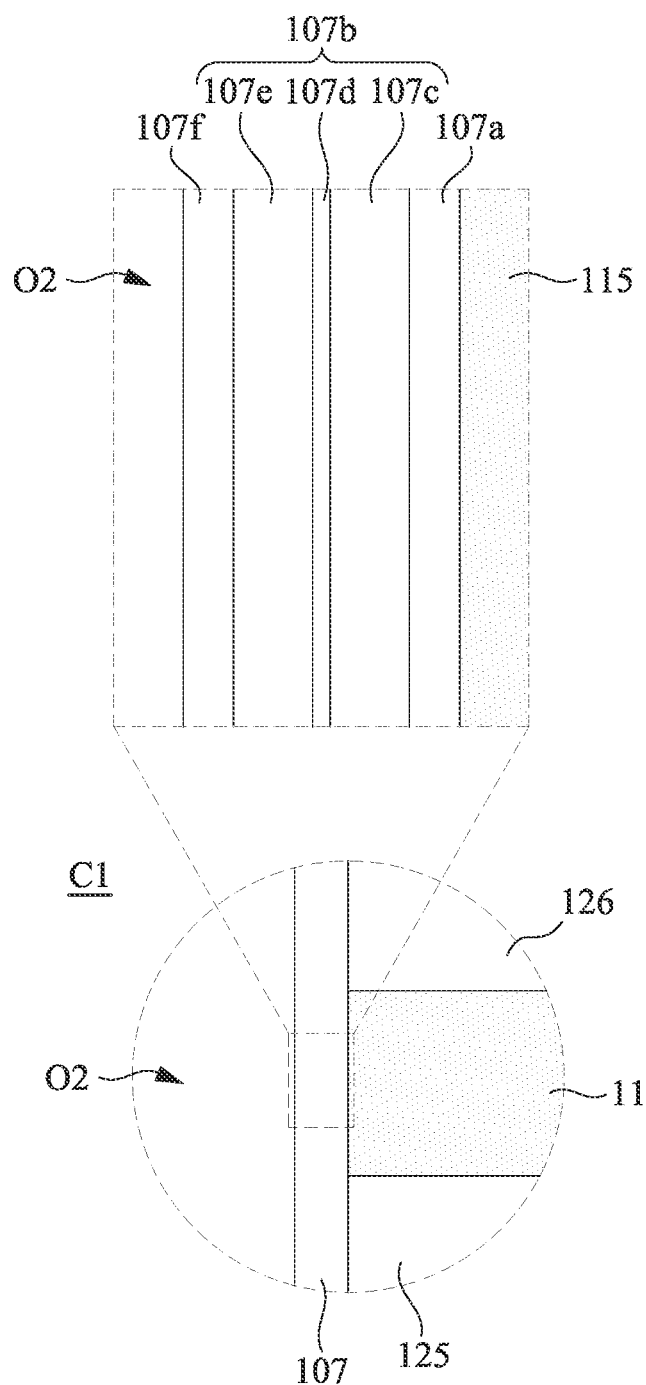

With reference to FIG. 6E, the tunneling layer 107f is formed on the second silicon nitride layer 107e of the charge storage stack 107b. In some embodiments, the tunneling layer 107f may be made of oxide (e.g. SiO2), SiON (silicon-oxide-nitride) or ONO (oxide-nitride-oxide). In some embodiments, the tunneling layer 107f can be formed by a chemical vapor deposition (CVD) process.

Figure 7:
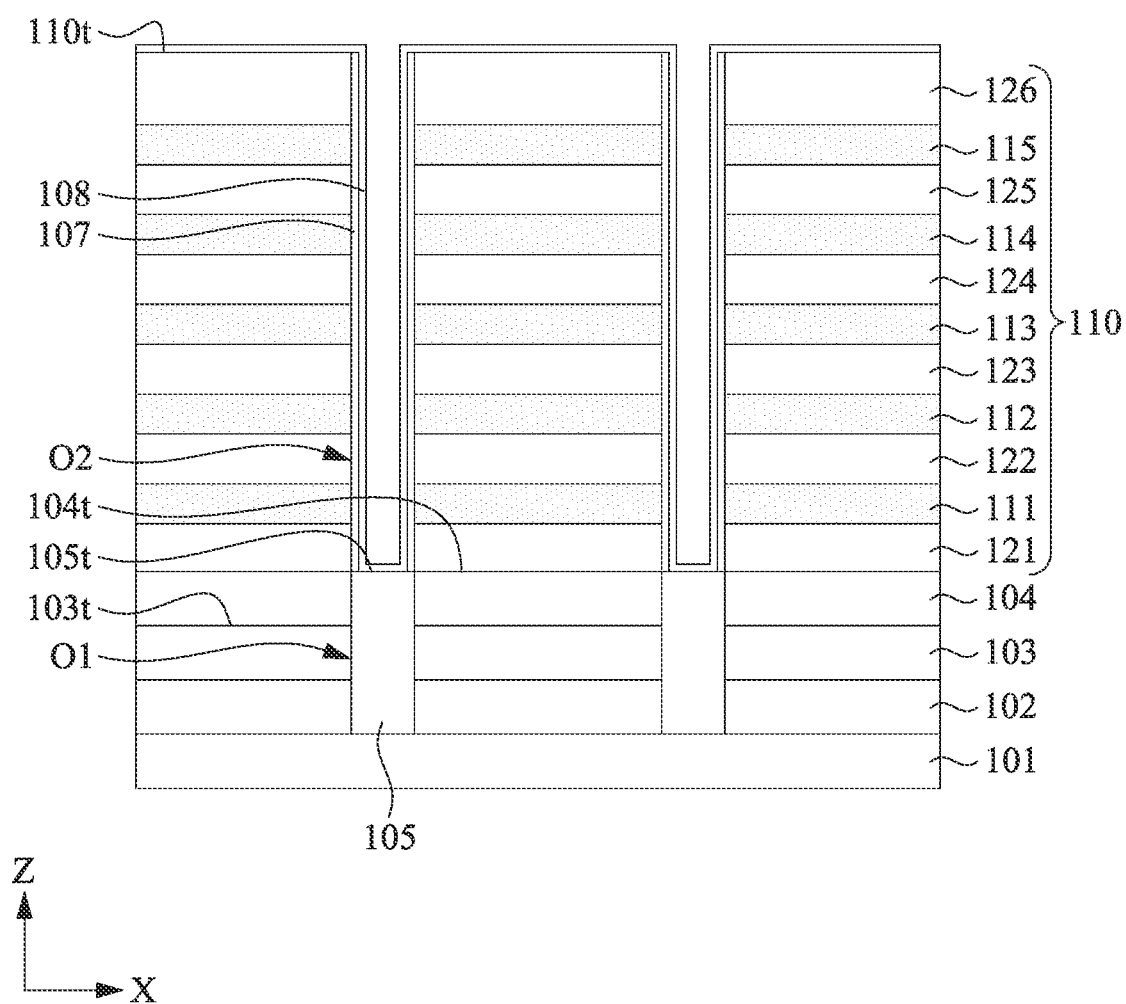

With reference to FIG. 7, a channel layer 108 is conformally deposited over the multi-layered memory structure 107, and thus the IC structure 100 may include a vertical channel flash memory device. Therefore, the multi-layered memory structure 107 is disposed between the channel layer 108 and the sacrificial layers 111-115. The channel layer 108 is electrically in contact with the top surface 105t of the contact plugs 105. In some embodiments, the channel layer 108 may be made of semiconductor material, such as such as poly-silicon (Si), Ge or other doped/undoped semiconductor material. For example, the channel layer 108 may be made of undoped poly-silicon.

Figure 8:
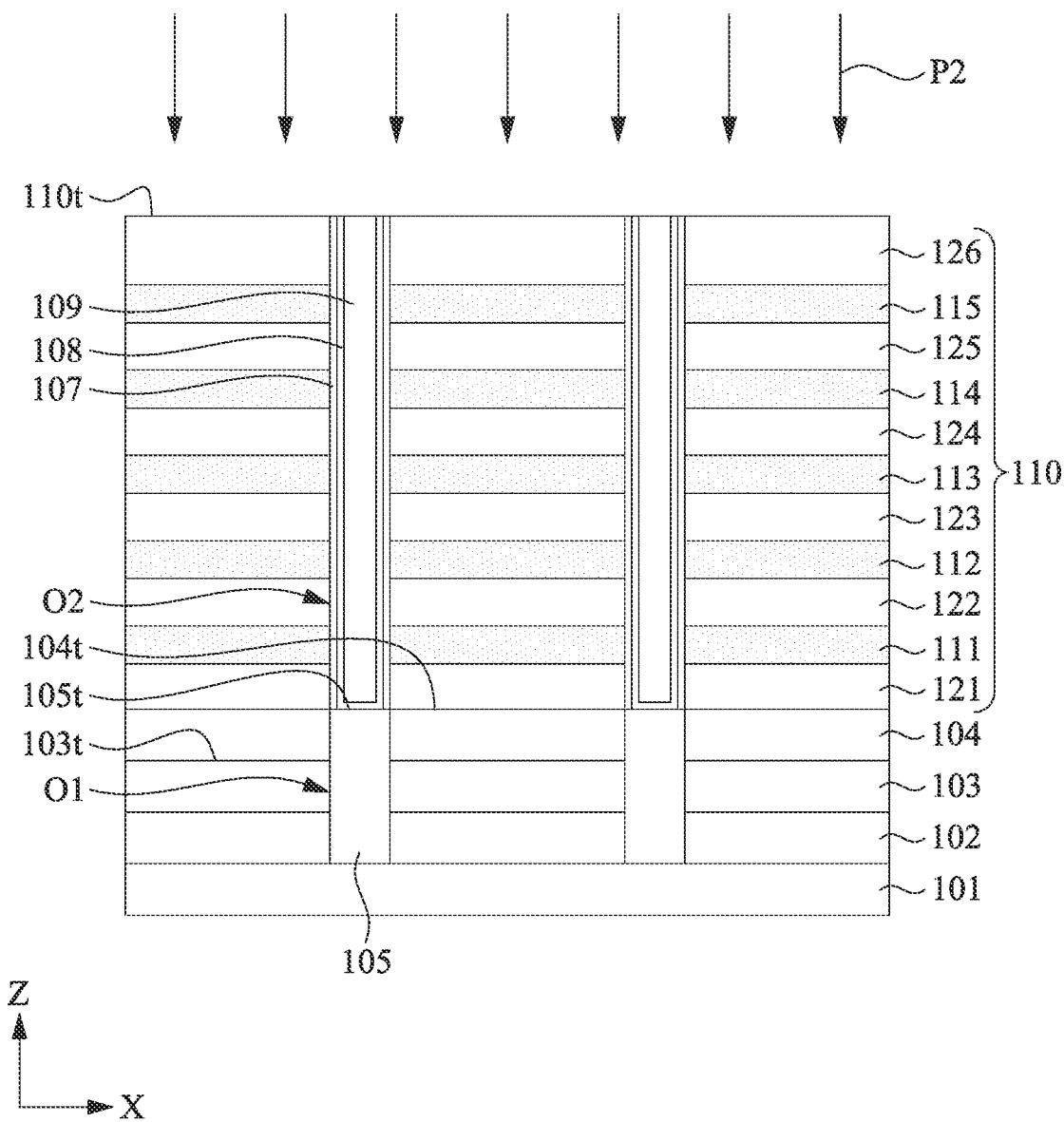

With reference to FIG. 8, a dielectric material 109 is deposited over the channel layer 108 and fills in the through openings O2. In some embodiments, the dielectric material 109 may be made of, such as silicon dioxide ($SiO_2$). In some embodiments, the dielectric material 109 may be made of a same material as the insulating layers 121-126. In some embodiments, the dielectric material 109 may be made of a different material than the insulating layers 121-126. Subsequently, a planarization process P2 (e.g., CMP) is performed to remove the excessive dielectric material 109 and channel layer 108 above the top surface 110t of the multi-layered stack 110. As a result of this method, the channel layer 108 wraps around the dielectric material 109 in the through openings O2. The multi-layered memory structure 107 wraps around the channel layer 108 in the through openings O2.

Figure 9:
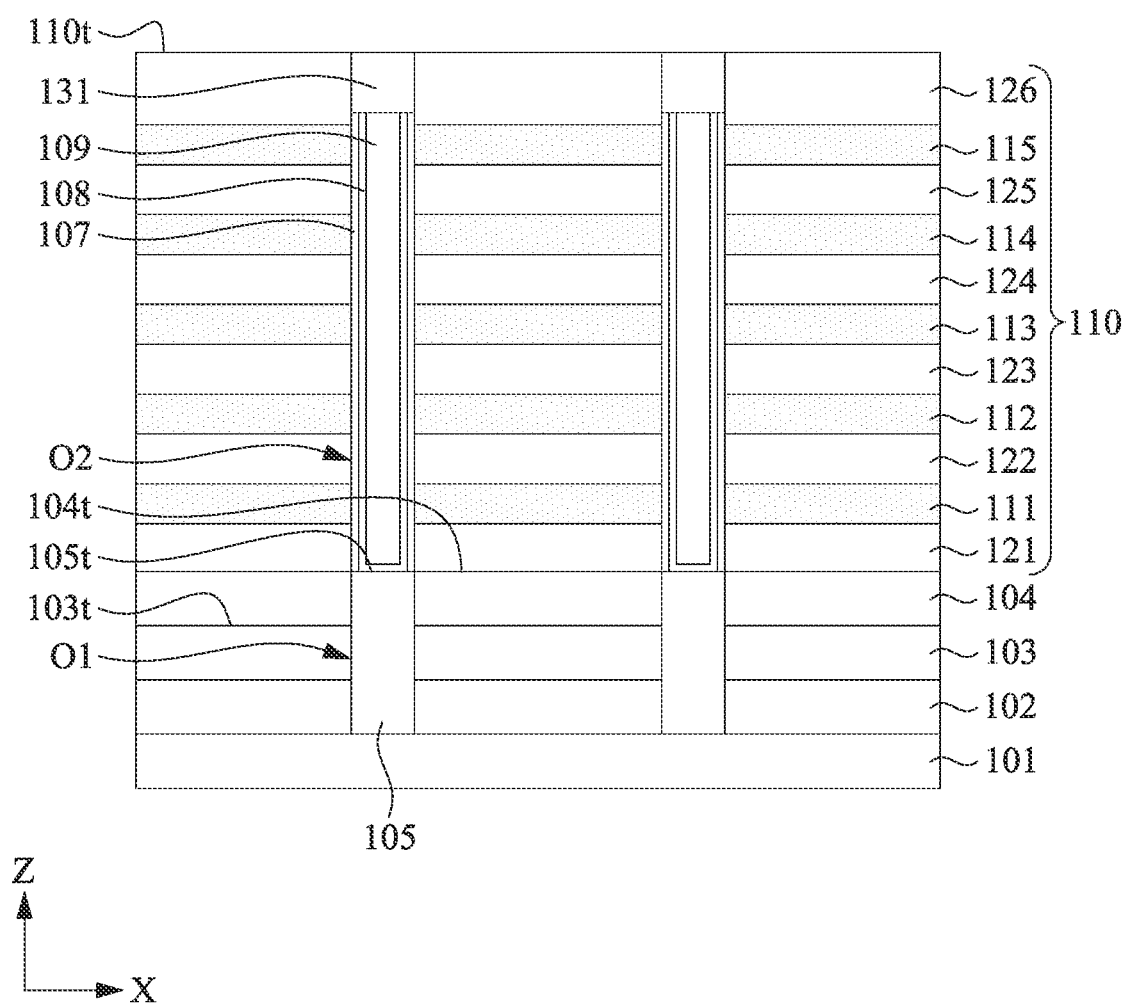

With reference to FIG. 9, an etching back process is performed on the dielectric material 109, the channel layer 108, and the multi-layered memory structure 107 to reappear upper portions of the through openings O2. In some embodiments, the etching back process may be a wet etching process, such as that in which the semiconductor substrate 101 is dipped in hydrofluoric acid (HF). In alternative embodiments, the etching back process may be a dry etching process. For example, the dry etching process may be performed using $HF/NH_3$ or $NF_3/NH_3$ as the etching gas. Subsequently, bonding pads 131 are formed in the upper portions of the through openings O2 and on the dielectric material 109 to form an electrical contact with the channel layer 108. In some embodiments, the bonding pads 131 is formed by depositing a poly-silicon (Si), Ge, normally, n-type dopants ($N^+$), such as phosphorus or arsenic over the multi-layered stack 110. Subsequently, a planarization process is performed to remove the excessive semiconductor material above the top surface 110t of the multi-layered stack 110. As a result of this method, the bonding pads 131 can be formed as shown in FIG. 9. In some embodiments, the bonding pad 131 can be a $P^+$ poly-silicon pad.

Figure 10:
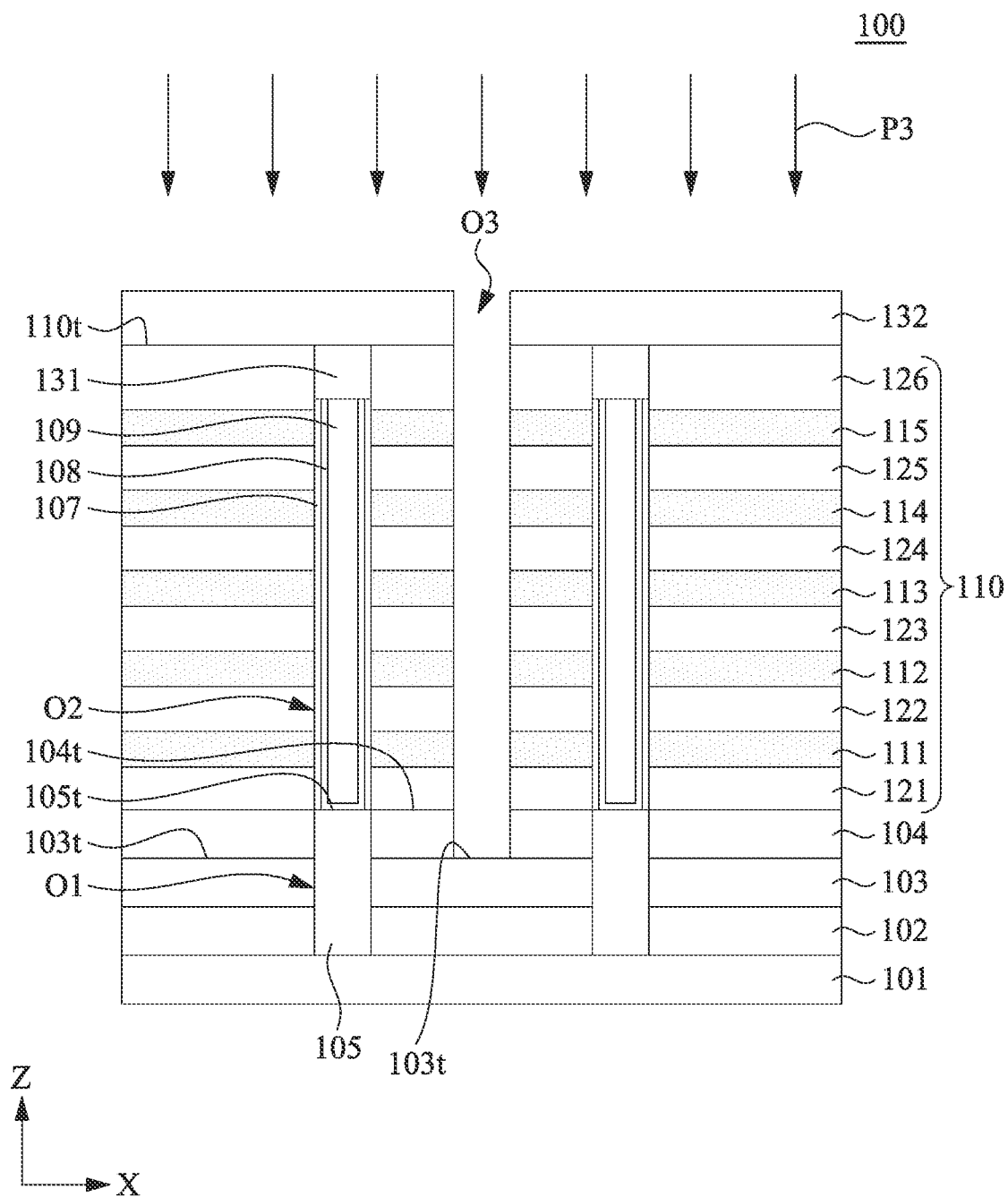

With reference to FIG. 10, a capping layer 132 is deposited over the bond pads 131 and the multi-layered stack 110. The capping layer 132 may be made of dielectric material, such as silicon oxide, silicon nitride (SiN), silicon oxynitride (SION), silicate or the arbitrary combinations thereof. Subsequently, an etching process P3 is performed to form a through opening O3 passing through the multi-layered stack 110 along the Z-direction and terminating at the top surface 103t of the conductive layer 103, so as to partially expose the sacrificing layers 111-115 and the insulating layers 121-126. In some embodiments, the etching process P3 can be an anisotropic etching process, such as a reactive ion etching (RIE) process, performed on the multi-layered stack 110 using a patterned hard mask layer (not shown) as an etching mask. In some embodiments, the through opening O3 can be interchangeably referred to a source line trench.

Figure 11:
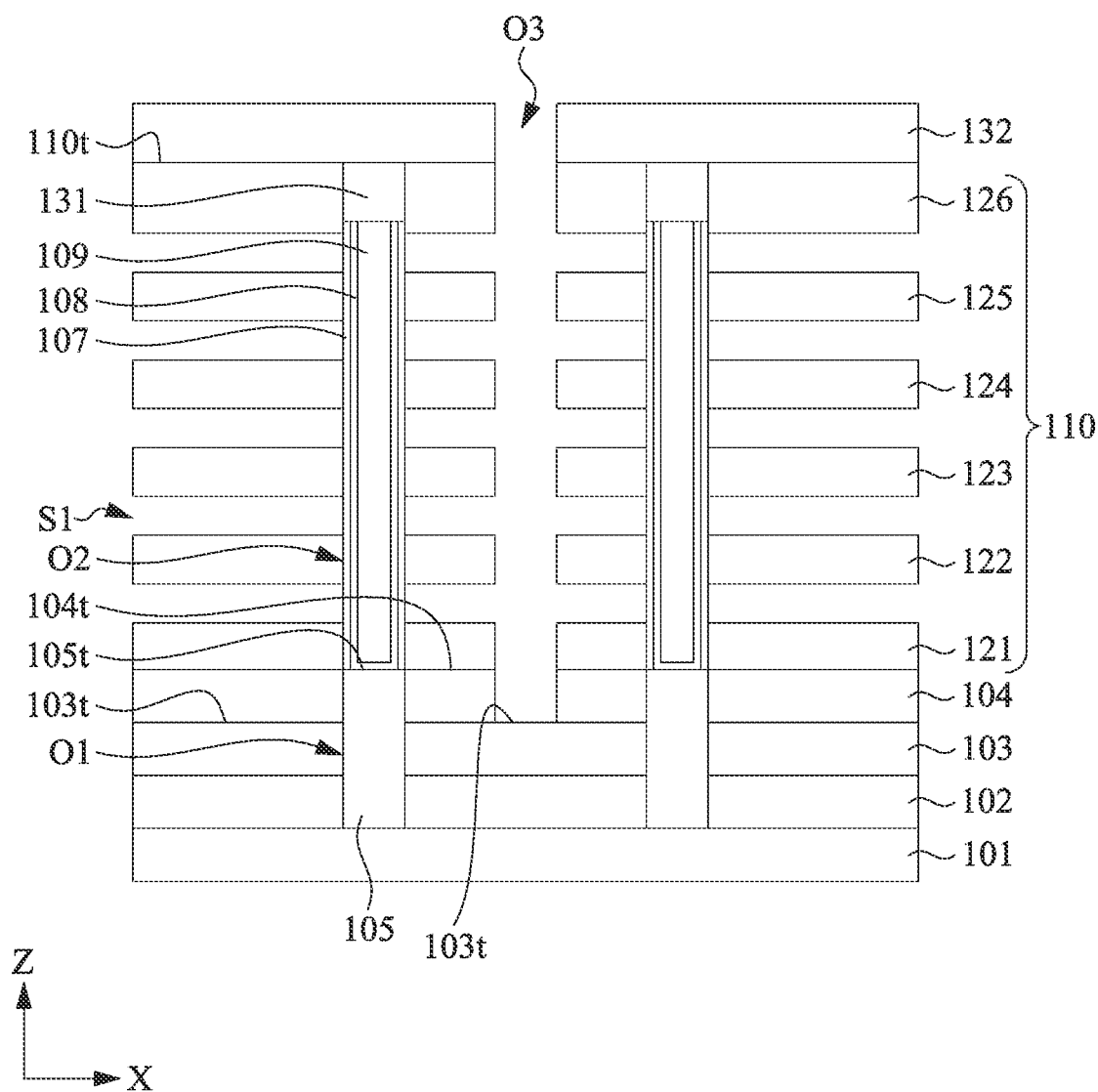

With reference to FIG. 11, the sacrificial layers 111-115 are removed, such as using phosphoric acid ($H_3PO_4$) solution, through the through opening O3 to expose portions of the multi-layered memory structure 107. Therefore, spaces S1 are formed to inherit the shapes of the sacrificial layers 111-115.

Figure 12:
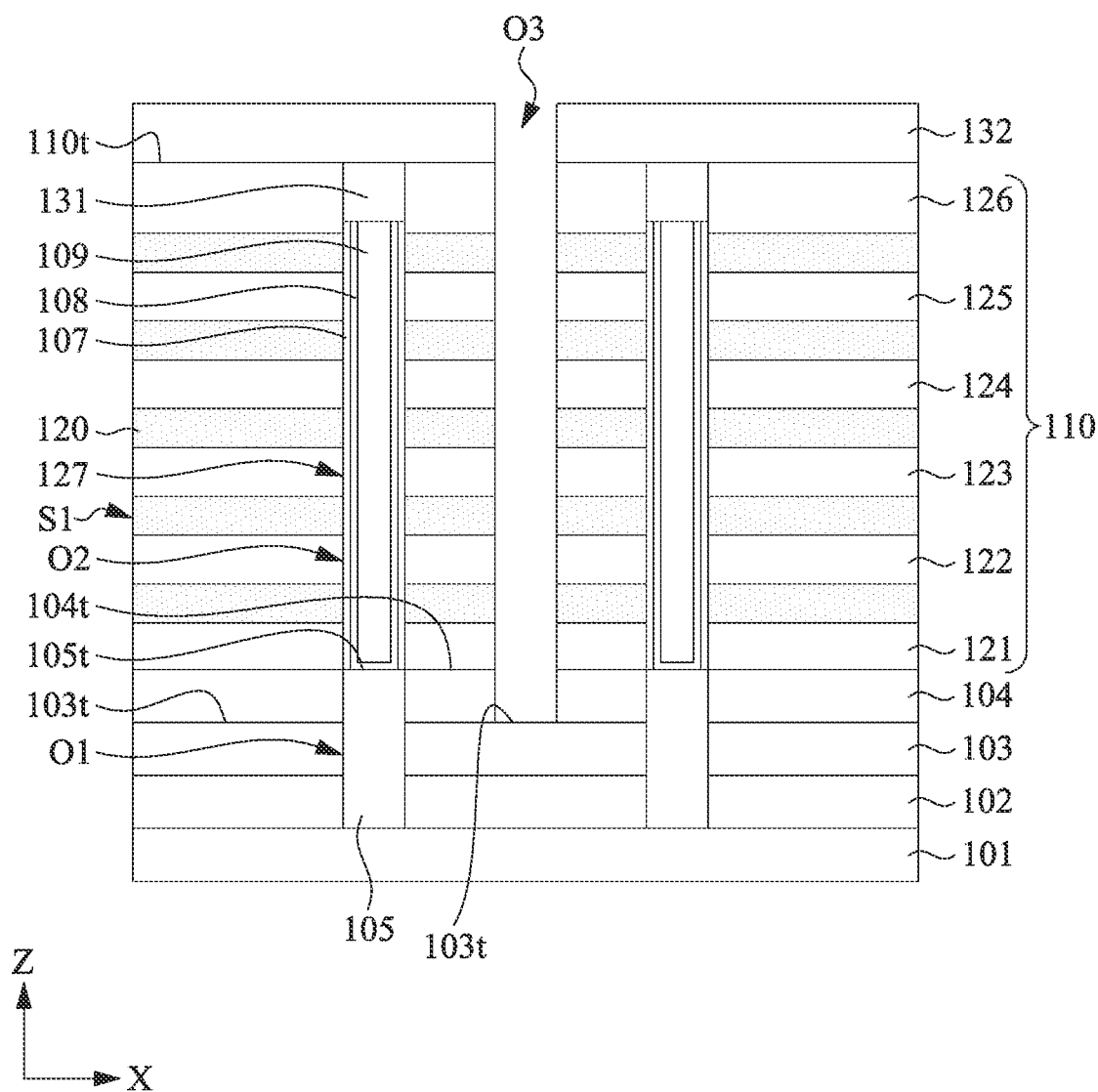

With reference to FIG. 12, a plurality of gate layers 120 are formed in the spaces S1 through the through opening O3. As a result, a plurality of memory cells 127 can be defined at the points of intersection between the gate layers 120, the multi-layered memory structure 107, and the channel layer 108, so as to form a memory cell array in the multi-layered stack 110. In some embodiments, the memory cells 127 can be interchangeably referred to memory devices 127. In some embodiments, the gate layers 120 may include poly-silicon, metal or other suitable conductive material. In some embodiments, the gate layers 120 may include metal layers, such as TiN/W, TaN/W, TaN/Cu, or the like. In some embodiments, the gate layers 120 may include dielectric layer, such as $AlO_x$. For example, each of the gate layers 120 can be a multi-layered structure including a high-K material layer (e.g., $HfO_x$ layer or $AlO_x$ layer), a TiN layer, and a tungsten layer.

Figure 13:
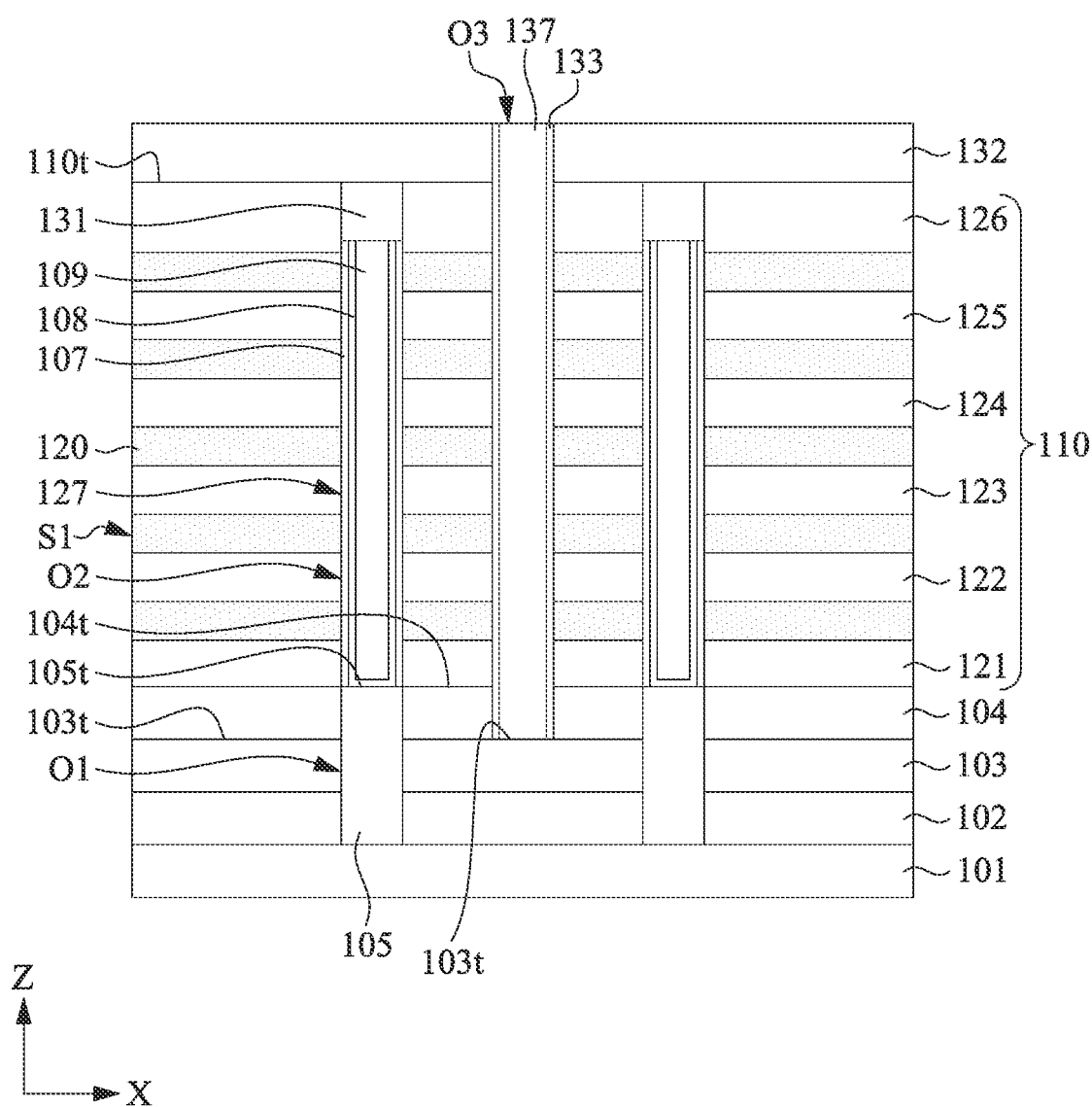

With reference to FIG. 13, a dielectric spacer 133 may be formed on the sidewalls of the through opening O3. Subsequently, a metal plug 137 may be formed in the dielectric spacer 133. The metal plug 137 can be electrically insulated from the gate layers 120 by the dielectric spacer 133. In some embodiments, the metal plug 137 can be interchangeably referred to a source line. In some embodiments, the dielectric spacer 133 may be made of dielectric material, such as silicon oxide, silicon nitride (SiN), silicon oxynitride (SiON), silicate, combinations thereof, or other suitable conductive materials. In some embodiments, the metal plug 137 may be made of TiN, TaN, Ti, Ta, Cu, Al, Ag, W, Ir, Ru, Pt, combinations thereof, or other suitable conductive materials.

Figure 14:
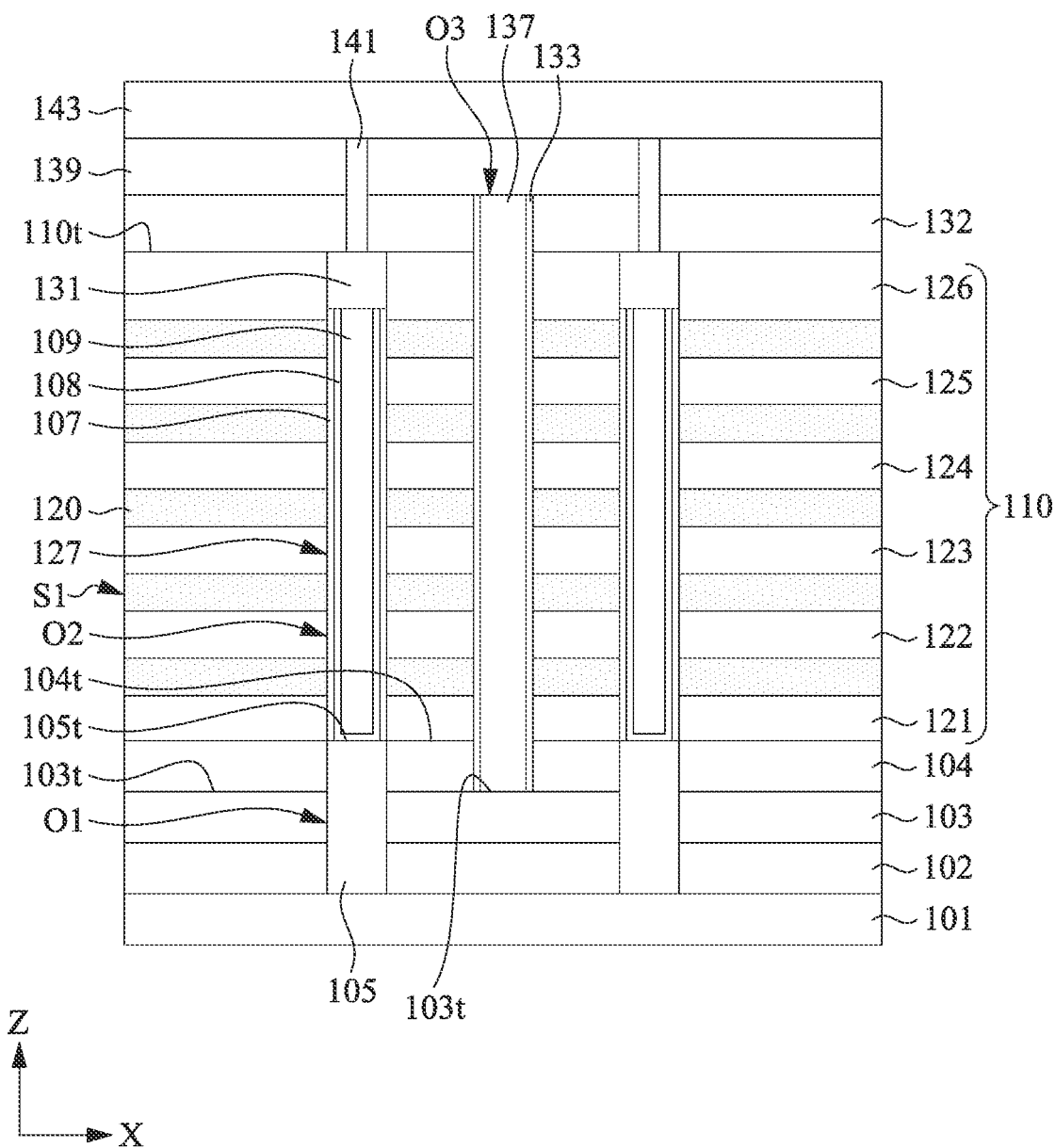

With reference to FIG. 14, an inter-layer dielectric (ILD) layer 139 is formed over the dielectric spacer 133 and the metal plug 137. Subsequently, a plurality of bit lines 143 electrically connected to the bonding pads 131 with an interconnection via 141 formed in the ILD layer 139. Subsequently, after a series of back end of line (BEOL) processes (not shown) are carried out, the integrated circuit (IC) structure 100 including a plurality of memory cells 127 is formed as shown in FIG. 14. In some embodiments, the memory cells 127 defined by the gate layers 120, the multi-layered memory structure 107, and the channel layer 108 can be electrically coupled to a decoder, such as a row decoder or a column decoder (not shown), through the bit lines 143. A current coming from the bit lines 143 can flow to the earth by passing through the channel layer 108, the contact plug 105, the conductive layer 103 (serving as the bottom common source line), the bonding pad 131, and the metal plug 137. In other words, the current path for performing the read/program operation does not flow through the semiconductor substrate 101. Therefore, the current path for performing the read/program operation can be decreased, such that the operation resistance and power consumption of the memory device can be reduced.

In some embodiments, the ILD layer 139 may be made of silicon oxide, silicon nitride (SiN), silicon oxynitride (SION), silicate, combinations thereof, or other suitable dielectric materials. In some embodiments, the bit line 143 may be made of TiN, TaN, Ti, Ta, Cu, Al, Ag, W, Ir, Ru, Pt, combinations thereof, or other suitable conductive materials. In some embodiments, the interconnection via 141 may be made of TiN, TaN, Ti, Ta, Cu, Al, Ag, W, Ir, Ru, Pt, combinations thereof, or other suitable conductive materials.

For next generation semiconductor devices, it is desirable to include memories that can provide high density storage. Therefore, a 3-dimensional (3D) integrated circuit (IC) memory device, such as 3D NAND, can provide high density storage by its multi-layered structure. However, the 3D NAND including a single charge storage layer with one composition may have a NAND retention issue.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a charge storage structure having a multi-layer sandwiched between a blocking layer and a tunneling layer of the 3D NAND to address the NAND retention issue. The multi-layer charge storage structure can be a composite layer having a nitride-oxide-nitride (NON) structure with a deep storage ability and a better data retention performance for the 3D NAND.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
 a plurality of gate layers laterally extending above a substrate and spaced apart from each other;
 a laterally stacked multi-layered memory structure extending upwardly above the substrate and through the gate layers and comprising:
  a blocking layer;
  a charge storage stack on the blocking layer and comprising a first silicon nitride layer, a second silicon nitride layer, and a silicon oxynitride layer sandwiched between the first and second silicon nitride layers, wherein the first silicon nitride layer and the second nitride layer are symmetrically arranged with respect to the silicon oxynitride layer, and have substantially the same thickness; and
  a tunneling layer on the charge storage stack; and
 a vertical channel layer on the laterally stacked multi-layered memory structure.

2. The IC structure of claim 1, wherein the first silicon nitride layer has a greater nitrogen atomic concentration than the second silicon nitride layer.

3. The IC structure of claim 2, wherein the first silicon nitride layer is in contact with the blocking layer.

4. The IC structure of claim 1, wherein the first silicon nitride layer has a less refractive index than the second silicon nitride layer.

5. The IC structure of claim 1, wherein the first silicon nitride layer has a refractive index in a range from about 2.00 to about 2.03, and the second silicon nitride layer has a refractive index in a range from about 2.07 to about 2.10.

6. The IC structure of claim 1, wherein the silicon oxynitride layer has a less refractive index than the first and second silicon nitride layers.

7. The IC structure of claim 1, wherein the silicon oxynitride layer has a refractive index in a range from about 1.52 to about 1.65.

8. The IC structure of claim 1, wherein the silicon oxynitride layer has a thinner thickness than the first and second silicon nitride layers.

9. The IC structure of claim 1, wherein the silicon oxynitride layer has a greater oxygen atomic concentration than the first and second silicon nitride layers.

10. The IC structure of claim 1, wherein the first and second silicon nitride layers are free of oxygen.

* * * * *